US008405214B2

United States Patent
Willey et al.

(10) Patent No.: US 8,405,214 B2
(45) Date of Patent: Mar. 26, 2013

(54) SEMICONDUCTOR PACKAGE STRUCTURE WITH COMMON GOLD PLATED METAL CONDUCTOR ON DIE AND SUBSTRATE

(75) Inventors: Aaron Willey, Boise, ID (US); Yantao Ma, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/208,349

(22) Filed: Aug. 12, 2011

(65) Prior Publication Data
US 2013/0037951 A1 Feb. 14, 2013

(51) Int. Cl.
*H01L 23/48* (2006.01)

(52) U.S. Cl. ........ 257/738; 257/737; 257/778; 257/774; 257/773; 257/784; 257/786; 257/712; 257/713; 257/717; 257/676; 257/720; 257/E23.011; 257/E25.013; 257/E23.067

(58) Field of Classification Search .......... 257/738, 257/737, 778.774, 773, 784, 786, 712, 713, 257/717, 676, 720
See application file for complete search history.

(56) References Cited

U.S. PATENT DOCUMENTS

| 7,521,794 | B2 * | 4/2009 | Yee et al. ...................... 257/720 |
| 7,566,590 | B2 * | 7/2009 | Zhong et al. .................. 438/119 |
| 7,674,652 | B2 * | 3/2010 | Farnworth et al. ............ 438/107 |
| 8,193,573 | B2 * | 6/2012 | Bronner et al. ................ 257/314 |
| 2002/0034066 | A1 * | 3/2002 | Huang et al. .................. 361/704 |
| 2003/0148599 | A1 * | 8/2003 | Kinsman ....................... 438/613 |
| 2004/0238934 | A1 * | 12/2004 | Warner et al. ................. 257/686 |
| 2006/0270107 | A1 * | 11/2006 | Morrison et al. ............. 438/106 |
| 2007/0164446 | A1 * | 7/2007 | Hawk et al. .................. 257/778 |
| 2007/0194415 | A1 * | 8/2007 | Seng et al. .................... 257/678 |
| 2007/0222054 | A1 * | 9/2007 | Hembree ....................... 257/686 |
| 2010/0208443 | A1 * | 8/2010 | Itaya et al. .................... 361/783 |
| 2011/0147919 | A1 * | 6/2011 | Sutardja ........................ 257/706 |

* cited by examiner

Primary Examiner — A O Williams
(74) Attorney, Agent, or Firm — Winston Hsu; Scott Margo

(57) ABSTRACT

A semiconductor package structure includes: a substrate comprising a plurality of power supply balls on a first surface of the substrate, a first metal conductor on a second surface of the substrate and at least one via coupling a power supply ball to the first metal conductor of the substrate; a die, comprising a plurality of bond pads on a first surface of the die, a first metal conductor on a second surface of the die and at least one via coupling a bond pad to the first metal conductor of the die; and a plurality of first wire bonds for coupling the first metal conductor of the substrate to the first metal conductor of the die.

24 Claims, 7 Drawing Sheets

TOP VIEW

SIDE VIEW

BOTTOM VIEW

SEMICONDUCTOR PACKAGE STRUCTURE WITH COMMON GOLD PLATED METAL CONDUCTOR ON DIE AND SUBSTRATE

BACKGROUND OF THE INVENTION

1. Field of the Invention

The present invention relates to a semiconductor package, and more particularly, to a semiconductor package structure that has low power supply inductance.

2. Description of the Prior Art

Memory, such as DRAM and logic devices are commonly used in modern computers and electronic products. These memory devices are usually packaged as a semiconductor chip. An exemplary DRAM package consists of a semiconductor DRAM die mounted under a single layer substrate. This is commonly known as a Board-on-Chip (BOC) design. One side of the die comprises a plurality of bond pads and can be referred to as a circuit side. The substrate also has a circuit side comprising a plurality of internal conductive traces and a plurality of external contacts in the form of power supply soldering balls, which communicate electrically with the traces on the substrate. The DRAM package is formed by bonding the circuit side of the die to the backside (non-circuit side) of the substrate. Traces are then coupled to the bond pads using wire bonds. Other package configurations are Chip-on-Board (COB) designs and Fine Ball Grid Array (FBGA) designs, both also have the same concept of power supply balls coupling to bond pads. In the following description, reference will be made to the BOC design for brevity.

Please refer to FIG. 1A, FIG. 1B and FIG. 1C, which represent, respectively, a top view, a first side view and a second side view of a conventional BOC DRAM package 10. FIG. 1A shows a package substrate 15 comprising a number of power supply balls 22, 24, 26 and a DRAM die 30 (represented by the dashed outline). The substrate 15 is rectangular in shape with a hollow middle section that exposes the die 30 underneath. The die 30 has a number of bond pads 32, 34, 36 located on the centre section of the die 30 which are exposed through the hollow middle section of the package substrate 15 as shown in FIGS. 1A and 1C. The first side view, shown in FIG. 1B, shows the package substrate 15 bonded to the die 30 from an end perspective and also shows the power supply balls including the power supply ball 26 on the circuit side of the package substrate 15. In FIG. 1C, the wire bonding between the package substrate 15 and the bond pad 32 on the die 30 is shown. Wire bond 42 couples the bond pad 32 to conductive traces (not shown) in the package substrate 15, which in turn are coupled to the power supply ball 22. The wire bonding is only from the circuit side of the substrate 15 to the circuit side of the die 30.

Please refer to FIG. 2 for a circuit-level illustration of the connections between the bond pads and the power supply balls. The diagram shows a single output circuit for simplicity, comprising an output driver coupled between two power supply balls 24, 26, respectively coupled to VSSQ and VDDQ with the output voltage DQ_Out being output through a third power supply ball 22 which is coupled between VDDQ_EXT and VSSQ_EXT (ground). Power supply balls 24, 26 are respectively coupled to bond pads 34, 36, and power supply ball 22 is coupled to bond pad 32. The current is pulled and pushed between VSSQ and VDDQ, and the switching results in a considerable amount of inductive Simultaneous Switching Output (SSO) Noise on the power supply rails.

One method to reduce this inductance is to increase the thickness of the bonding wires. This is not very effective, however, as the number of bonding wires that can be used is limited by the space available in the package. Modern designs tend to have a congested routing environment; using thicker wires would therefore involve increasing the size of the substrate, which is unlikely to provide an effective solution to high speed SSO noise reduction. Modern high speed I/O package designs require a minimized power supply inductance in conjunction with a small substrate size.

SUMMARY OF THE INVENTION

With this in mind, the present invention aims to provide a DRAM package that can reduce the amount of inductance as well as providing a greater surface area available for bonding.

A semiconductor package structure according to an exemplary embodiment of the present invention comprises: a substrate comprising a plurality of power supply balls on a first surface of the substrate, a first metal conductor on a second surface of the substrate and at least one via coupling a power supply ball to the first metal conductor of the substrate; a die, comprising a plurality of bond pads on a first surface of the die, a first metal conductor on a second surface of the die and at least one via coupling a bond pad to the first metal conductor of the die; and a plurality of first wire bonds for coupling the first metal conductor of the substrate to the first metal conductor of the die.

A method of forming a semiconductor package according to an exemplary embodiment of the present invention comprises: providing a substrate comprising a plurality of power supply balls on a first surface of the substrate; plating a first metal conductor on a second surface of the substrate; forming at least one via that couples a power supply ball to the first metal conductor of the substrate; providing a die comprising a plurality of bond pads on a first surface of the die; plating a first metal conductor on a second surface of the die; forming at least one via that couples a bond pad to the first metal conductor of the die; and coupling the first metal conductor of the substrate to the first metal conductor of the die.

These and other objectives of the present invention will no doubt become obvious to those of ordinary skill in the art after reading the following detailed description of the preferred embodiment that is illustrated in the various figures and drawings.

DETAILED DESCRIPTION

The present invention therefore aims to provide a semiconductor package structure that has reduced inductance while still maintaining the small size of the substrate. Various embodiments for achieving this aim will be detailed in the following.

In this disclosure, the invention will be discussed with reference to reducing the inductance on the ground power supply rail (the VSSQ). The method for reducing the inductance on the VSSQ power supply rail involves establishing a common ground reference point, which eliminates the need for an isolated ground point or multiple ground points. As ground will always remain the same, it is more practical to have one common ground reference while still allowing different values for VCC/VDDQ; i.e. if there is a change in current demand, a different power supply ball can be used as VDDQ while VSSQ remains at the same potential. It should be obvious to one skilled in the art, however, that the following methods and principles can equally be applied to VDDQ without departing from the spirit of the present invention. Reducing inductance at VSSQ is a preferred embodiment and not a limitation.

In the following, the spirit of the invention will be described with reference to a DRAM package structure, but one skilled in the art will easily be able to apply the concepts set out in this disclosure to other memory devices such as logic devices. Additionally, the accompanying drawings illustrate a BOC DRAM package design, but one skilled in the art will understand that the following concepts can also be applied to other package designs such as COB and FBGA designs.

As set out in the above, the present invention introduces a common ground reference to a semiconductor package such as a DRAM. This is achieved by plating the back side of the die and the back side of the package substrate with metal or any types of conductive plating. These back side metal plates/back side conductors are then coupled together such that the entire package has one common power supply reference plate. This strong common ground reference means that, during SSO switching between VSSQ and VDDQ, the voltage drop will be minimized and therefore the inductance at the VSSQ power supply rail is reduced. The packaging means of providing the common ground reference has the added advantage of increasing the amount of space available for wire bonding between the die and the package substrate.

Figure 3:
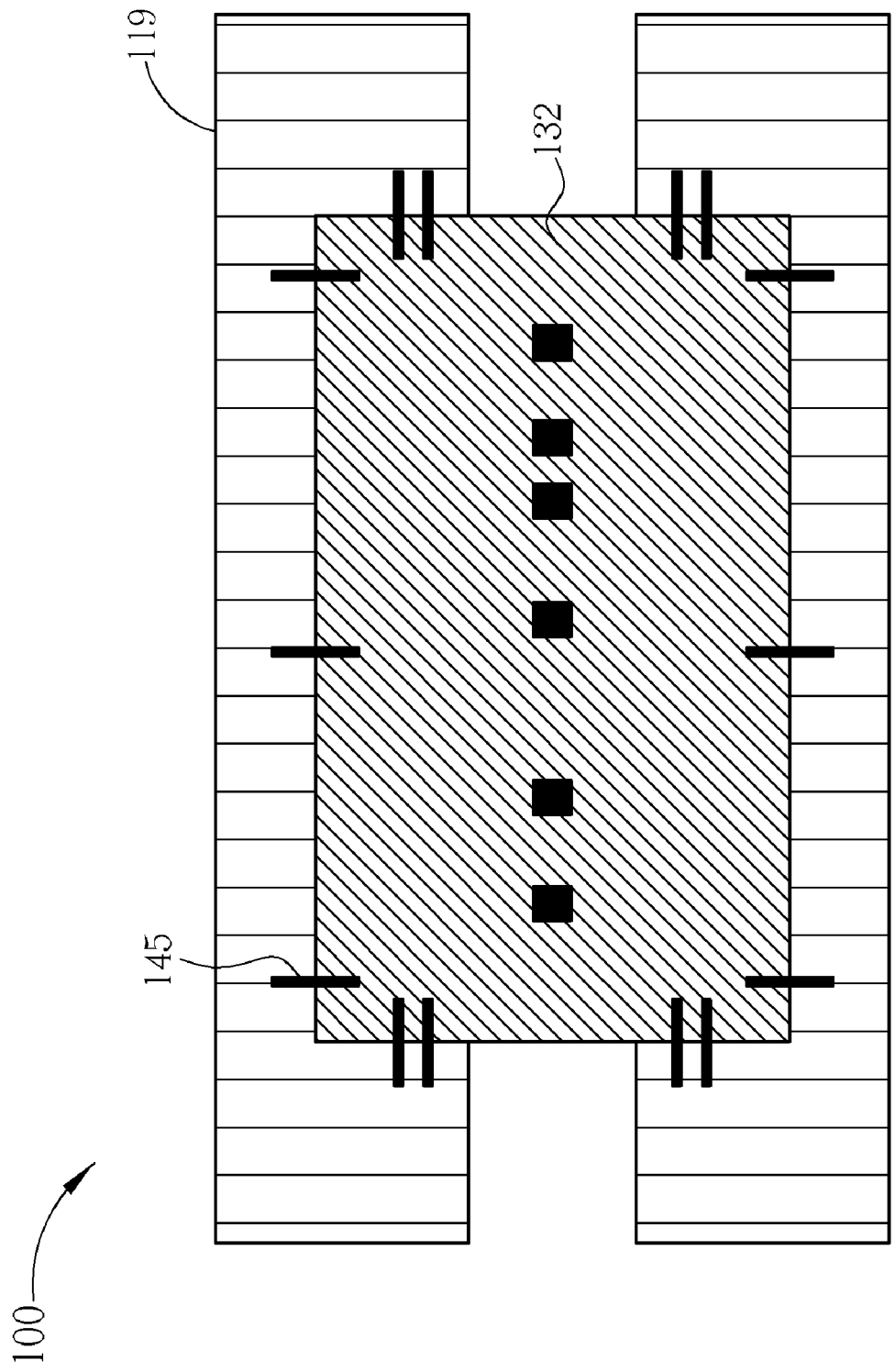
FIG. 3 is a bottom view diagram of a DRAM package according to an exemplary embodiment of the present invention.

Please refer to FIG. 3, which is a bottom view of a semiconductor package 100 consisting of a package substrate and die, wherein both the back side of the package substrate and the back side of the die have been plated with a conductor (gold, for example). The package substrate back side conductor 119 and the die back side conductor 132 are coupled by means of VSS wire bonds 145. Therefore, a common ground reference plate is formed for both the package substrate and the die. These VSS wire bonds 145 are not coupled to the circuit side of the die or the circuit side of the package substrate.

Figure 1A:
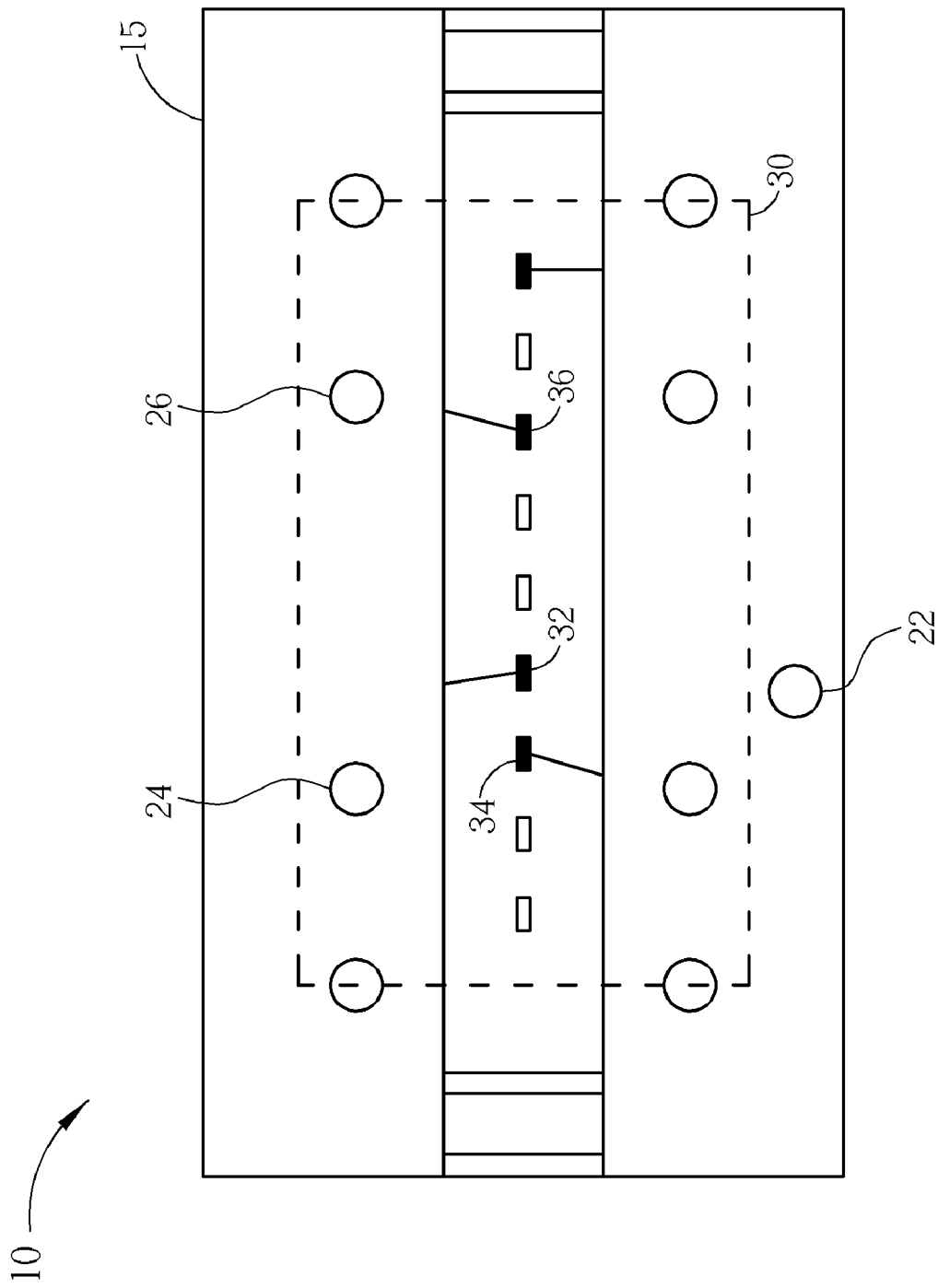
FIG. 1A is a top view diagram of a prior art die and package.
Figure 1B:
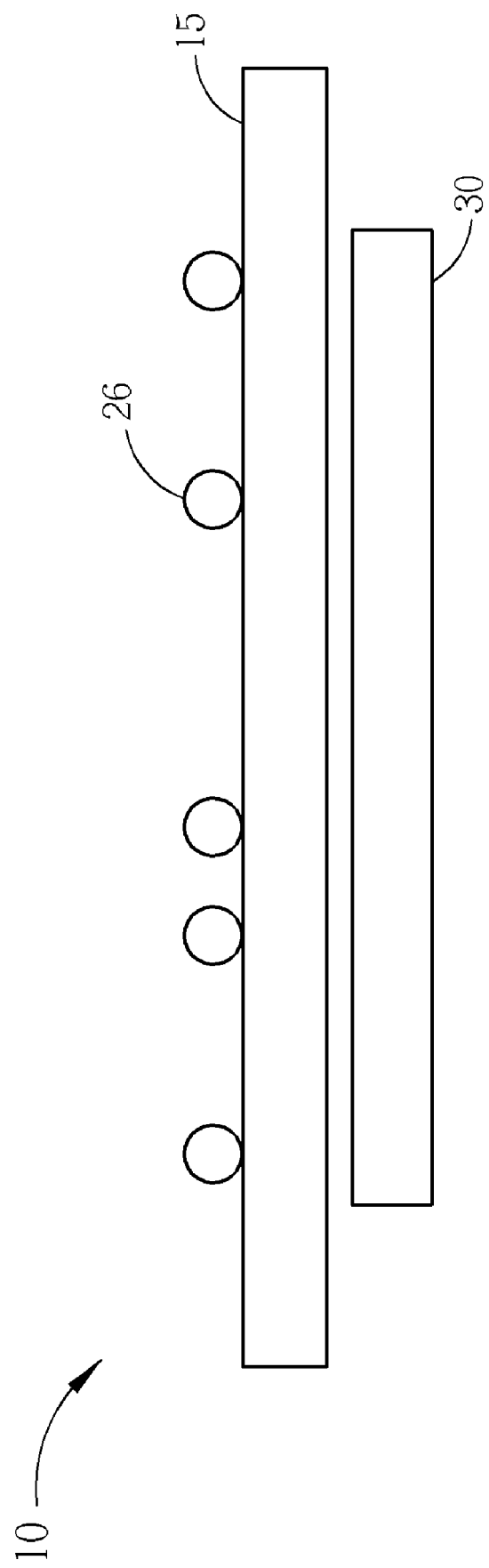
FIG. 1B is a first side view diagram of a prior art die and package.
Figure 1C:
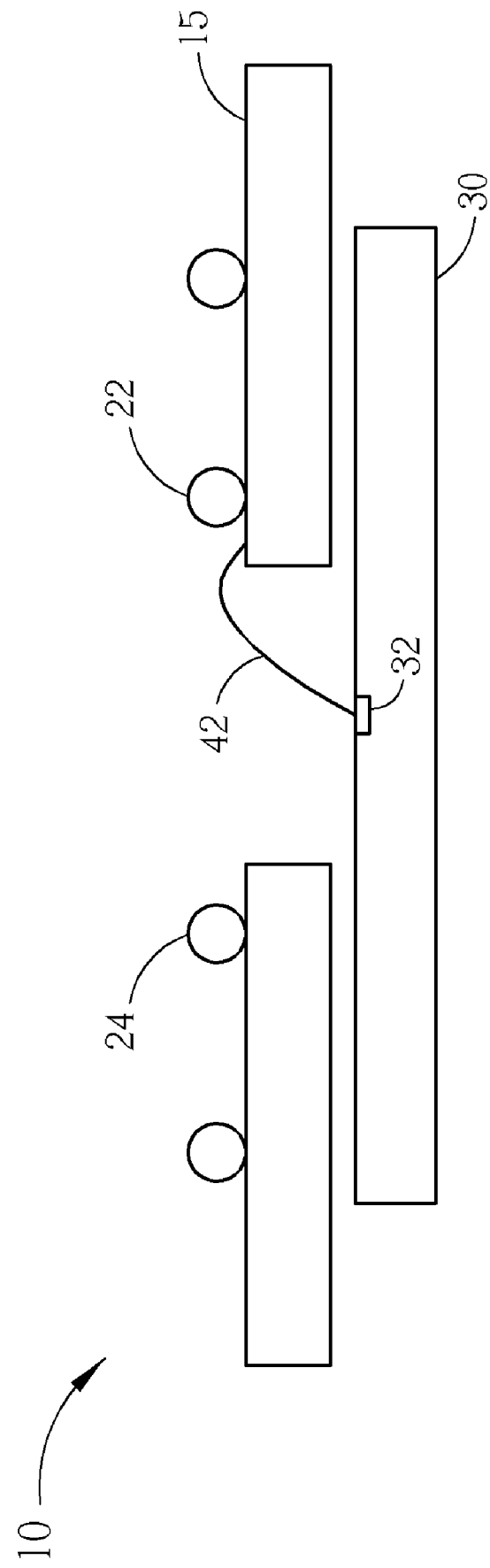
FIG. 1C is a second side view diagram of a prior art die and package.

In the conventional art shown in FIGS. 1A, 1B and 1C, wire bond 42 coupled the bond pad 22 on the die 30 to substrate traces on the package substrate 15, which were in electrical communication with the power supply ball 22. Coupling occurred from the circuit side of the die 30 to the circuit side of the package substrate 15 only. The DRAM package 100 of the present invention uses a back-to-front (i.e. back side to circuit side) coupling scheme to both enable the common ground reference for the DRAM package 100 and increase the amount of area available for wire bonding. In order to allow this back-to-front coupling, vias are introduced in both the package substrate and the die.

Figure 4:
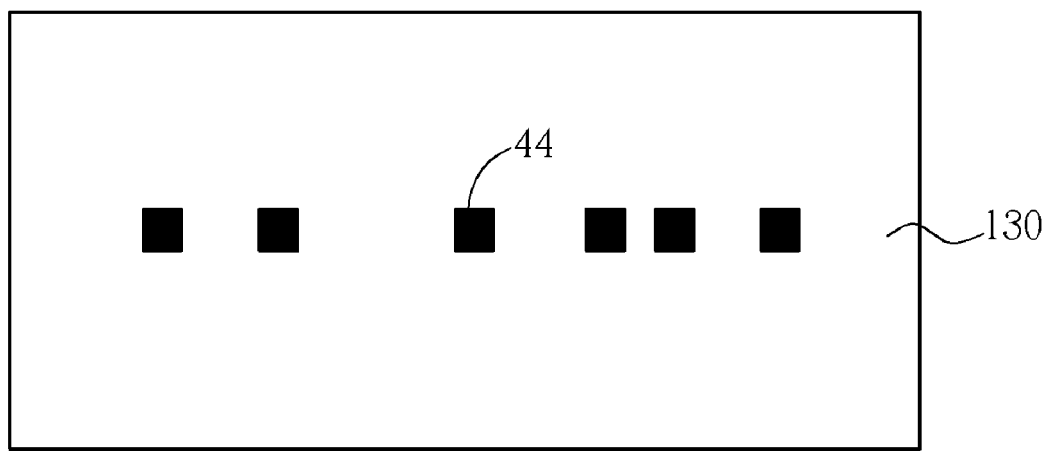
FIG. 4 is a diagram showing three views of the die in FIG. 3.
Figure 4:
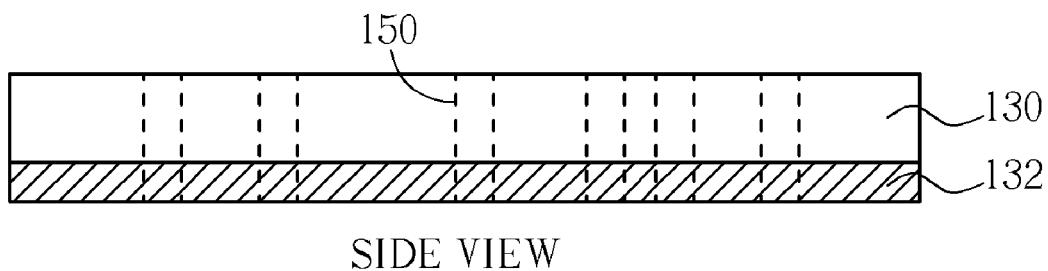
Figure 4:
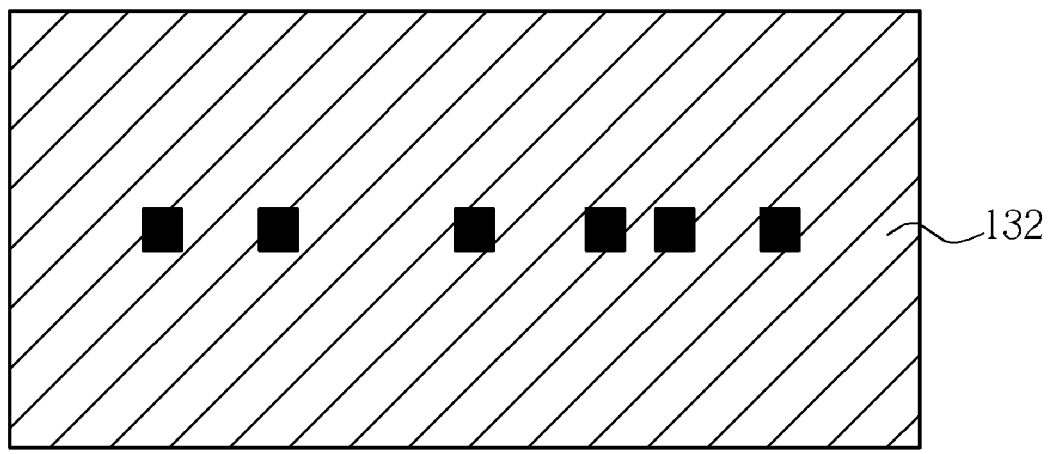

Please refer to FIG. 4, which are diagrams illustrating top, side and bottom views of the die 130 of the DRAM package 100. As is shown, the circuit side of the die 130 has a number of bond pads including bond pad 44 which are located on the centre section of the die 130. These are illustrated in the top view diagram. The present invention introduces through silicon vias (TSV) which connect the circuit side of the die 130 to the backside of the die 130, including TSV 150 which couples to bond pad 44 for coupling bond pad 44 to ground. When these vias are formed directly below the bond pads, as shown in FIG. 4, they therefore couple the bond pads to the back side conductor 132 (VSSQ in this embodiment). Please note that through silicon vias are a technology commonly used in semiconductor packages and there are many methods that can be used to form them: for example, plasma etch technology which is often used for deep silicon etching in memory devices. The formation of the TSVs is not limited to a particular process. Furthermore, the TSVs are not limited to be created at a certain stage in the manufacturing process; both via-last and via-first processes are well-known to those skilled in the field of semiconductor technology.

The bottom view in FIG. 4 shows the back side of the die 130 that has been plated to form the back side conductor 132, as well as showing the location of the through-silicon-vias (which correspond to the location of the bond pads in this embodiment). The through-silicon-vias couple the bond pads directly to ground, whereas in the prior art the bond pads are coupled to ground via wire bonds, the substrate traces and power supply balls. Utilizing the back side of the die as the common ground reference for the package 100 and coupling the bond pads internally to the back side conductor 132 therefore reduces the number of wire bonds that are required on the circuit side of the die 130, resulting in a greater area of the die being available for coupling bond pads to VDDQ. Further, the use of the common ground reference provides better current return paths and loop inductances to handle much higher speed I/O designs.

Figure 2:
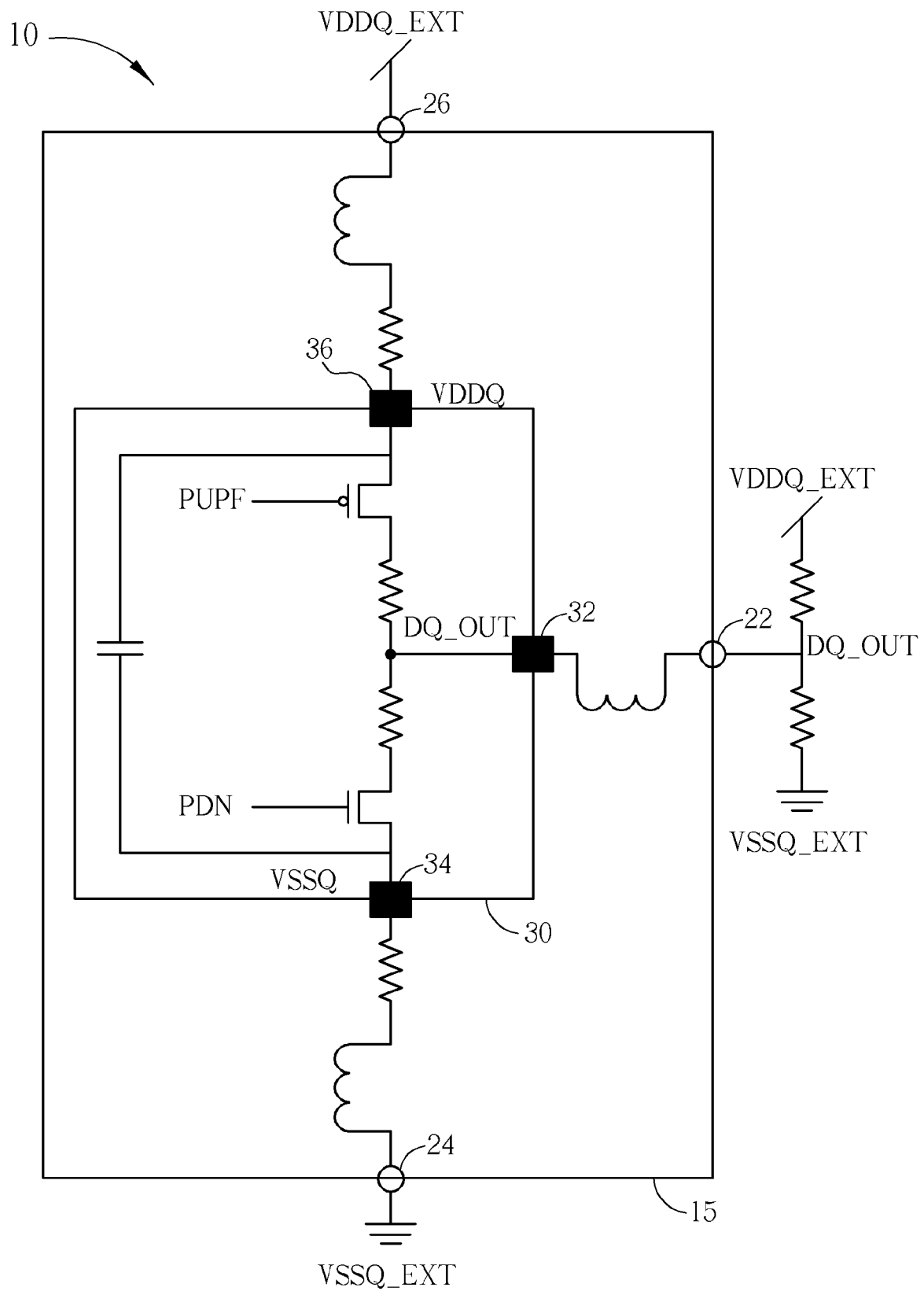
FIG. 2 is a circuit level diagram of the prior art die and package shown in FIG. 1.

As shown in the circuit diagram of FIG. 2, power supply ball 24 is coupled to ground (VSSQ). In the package 100 of the present invention, the back side conductor 119 (shown in FIG. 3) of the package substrate functions as the common ground reference for the package 100. In order to enable a connection between the back side conductor 119 and power supply balls on the circuit side of the package substrate, through-silicon-vias are created in the package substrate.

Figure 5:
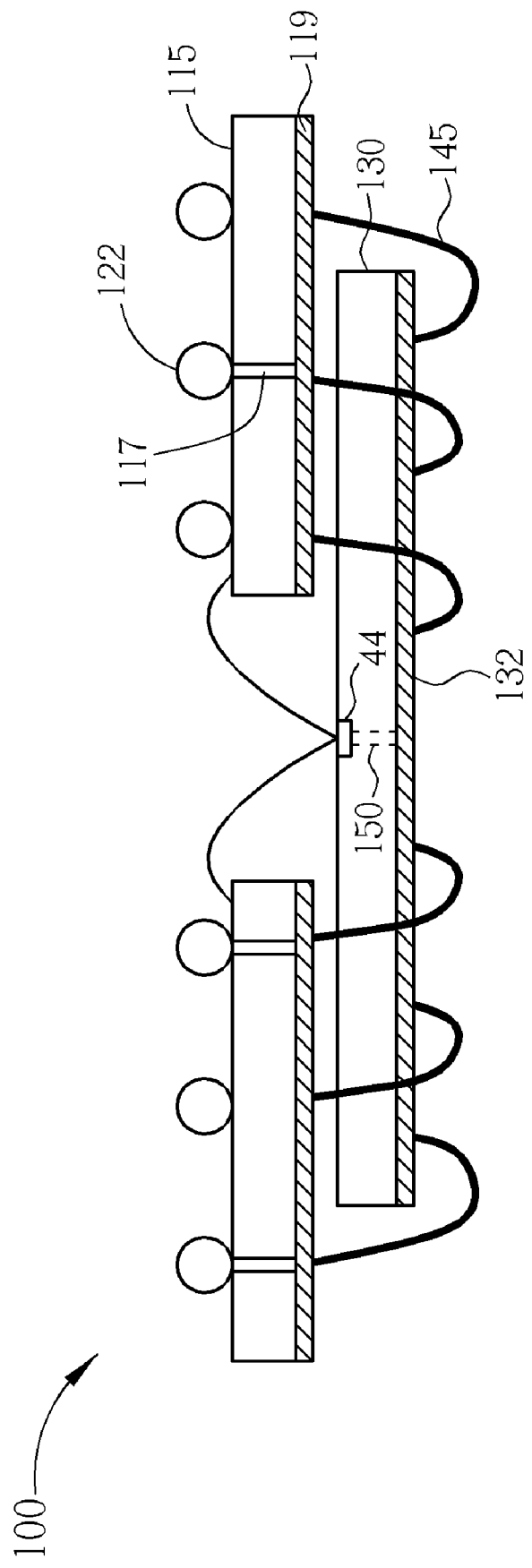
FIG. 5 is a side view diagram of the DRAM package shown in FIG. 3.

Please refer to FIG. 5 in conjunction with FIG. 4 and FIG. 3. FIG. 5 shows a side view of the die 130 in FIG. 4 assembled into a package 100, including the through-silicon-vias 117 in the package substrate 115 and the die 130, as well as the VSS wire bonds 145 connecting the package substrate back side conductor 119 with the die back side conductor 132. A single via 150 in the die 130 for coupling the bond pad 44 on the circuit side of the die 130 to the back side conductor 132 is shown here for simplicity, and is represented by the vertical dashed lines. A via 117 in the package substrate 115 is also illustrated, and shows how a power supply ball 122 is connected to the package back side conductor 119. It should be noted that the bond pads on the circuit side of the die 130 still require wire bonds for coupling the bond pads to VDDQ via traces in the package substrate 115. The use of the vias in the package substrate 115 and the die 130, however, mean that coupling to VSSQ occurs from front-to-back (circuit side to back side) and therefore the number of wire bonds needed on the circuit side of the die 130 is reduced by approximately one half.

As the position and arrangement of bond pads on the circuit side of the die 130, and traces and power supply balls on the circuit side of the package substrate 115 do not need to be modified, this invention is easy to implement in the industry.

Furthermore, when the invention is applied to reducing inductance on the VDDQ power supply rail and more than one common VDDQ supply reference is required, the back plate can be split, thereby allowing the power supply balls to be coupled to numerous different common supply potentials.

The through silicon vias in the die can be formed during standard die processing, and the plating of the package substrate and the formation of vias in the package substrate can occur during the package assembly process. Due to the strong common ground reference as a result of the back side plating, when voltage switching occurs, the drop between VSSQ and VDDQ remains constant. Signal Noise Ratio (SNR) is therefore greatly improved. In conventional memory packages, inductance noise may be as much as 400 mV but the present invention can lower the inductance by a magnitude of 10.

In summary, the present invention has the double advantages of reducing inductance and increasing the amount of space available for bonding. Utilizing vias rather than wires for VSSQ coupling reduces the amount of inductance and noise, and the backside plating results in a strong common ground reference for the entire package 100. It is also possible to keep the VSSQ connections as in the prior art and implement the structure of the present invention for achieving a common VDDQ reference.

Those skilled in the art will readily observe that numerous modifications and alterations of the device and method may be made while retaining the teachings of the invention.

What is claimed is:

1. A semiconductor package structure, comprising:
    a substrate comprising a plurality of power supply balls on a first surface of the substrate, a first metal conductor on a second surface of the substrate and at least one via coupling a power supply ball to the first metal conductor of the substrate;
    a die, comprising a plurality of bond pads on a first surface of the die, a first metal conductor on a second surface of the die and at least one via coupling a bond pad to the first metal conductor of the die; and
    a plurality of first wire bonds for coupling the first metal conductor of the substrate to the first metal conductor of the die;
    wherein the first metal conductor of the die and the first metal conductor of the substrate are both formed by gold plating.

2. The semiconductor package of claim 1, further comprising a plurality of second wire bonds for coupling at least a bond pad to at least a power supply ball, wherein said bond pad is not coupled to the first metal conductor of the die and said power supply ball is not coupled to the first metal conductor of the substrate.

3. The semiconductor package of claim 1, wherein the first metal conductor of the die and the first metal conductor of the substrate are a common ground reference for the semiconductor package.

4. The semiconductor package of claim 1, wherein the first metal conductor of the die and the first metal conductor of the substrate are a common power supply reference for the semiconductor package.

5. The semiconductor package of claim 1, wherein the substrate further comprises:
    a second metal conductor on the second surface of the substrate, and at least one via coupling a power supply ball to the second metal conductor of the substrate;
    the die further comprises:
    a second metal conductor on the second surface of the die, and at least one via coupling a power supply ball to the second metal conductor of the die;
    and the semiconductor package further comprises:
    a plurality of third wire bonds for coupling the second metal conductor of the substrate to the second metal conductor of the die;
    wherein the first metal conductors and the second metal conductors are different power supplies.

6. The semiconductor package of claim 5, wherein the first metal conductors are a common ground reference for the semiconductor package and the second metal conductors are a common power supply reference for the semiconductor package.

7. The semiconductor package of claim 1, being a DRAM package.

8. The semiconductor package of claim 7, having a Board-on-Chip (BOC) architecture.

9. The semiconductor package of claim 7, having a Chip-on-Board (COB) architecture.

10. The semiconductor package of claim 7, having a Fine Ball Grid Array (FBGA) architecture.

11. The semiconductor package of claim 1, being a logic device memory package.

12. A method of forming a semiconductor package, comprising:
    providing a substrate comprising a plurality of power supply balls on a first surface of the substrate;
    plating a first metal conductor on a second surface of the substrate;
    forming at least one via that couples a power supply ball to the first metal conductor of the substrate;
    providing a die comprising a plurality of bond pads on a first surface of the die;
    plating a first metal conductor on a second surface of the die;
    forming at least one via that couples a bond pad to the first metal conductor of the die; and
    coupling the first metal conductor of the substrate to the first metal conductor of the die;
    wherein the first metal conductor of the die and the first metal conductor of the substrate are both plated with gold plating.

13. The method of claim 12, wherein the step of coupling the first metal conductor of the substrate to the first metal conductor of the die comprises:
    providing a plurality of first wire bonds; and
    utilizing the plurality of first wire bonds to couple the first metal conductor of the substrate to the first metal conductor of the die.

14. The method of claim 13, further comprising:
    providing a plurality of second wire bonds; and
    utilizing the plurality of second wire bond pads to couple at least a bond pad to at least a power supply ball;
    wherein said bond pad is not coupled to the first metal conductor of the die and said power supply ball is not coupled to the first metal conductor of the substrate.

15. The method of claim 12, wherein the first metal conductor of the die and the first metal conductor of the substrate are a common ground reference for the semiconductor package.

16. The method of claim 12, wherein the first metal conductor of the die and the first metal conductor of the substrate are a common power supply reference for the semiconductor package.

17. The method of claim 12, further comprising:
    plating a second metal conductor on the second surface of the substrate;
    forming at least one via that couples a power supply ball to the second metal conductor of the substrate;

plating a second metal conductor on the second surface of the die;

forming at least one via that couples a bond pad to the second metal conductor of the die; and coupling the second metal conductor of the substrate to the second metal conductor of the die;

wherein the first metal conductors and the second metal conductors are different power supplies.

18. The method of claim 17, wherein the first metal conductors are a common ground reference for the semiconductor package and the second metal conductors are a common power supply reference for the semiconductor package.

19. The method of claim 17, wherein the step of coupling the second metal conductor of the substrate to the second metal conductor of the die comprises:

providing a plurality of third wire bonds; and utilizing the plurality of third wire bonds to couple the second metal conductor of the substrate to the second metal conductor of the die.

20. The method of claim 12, wherein the semiconductor package is a DRAM package.

21. The method of claim 20, wherein the DRAM package has a Board-on-Chip (BOC) architecture.

22. The method of claim 20, wherein the DRAM package has a Chip-on-Board (COB) architecture.

23. The method of claim 20, wherein the DRAM package has a Fine Ball Grid Array (FBGA) architecture.

24. The method of claim 12, wherein the semiconductor is a logic device memory package.

\* \* \* \* \*